US009180686B1

(12) United States Patent
McKinley et al.

(10) Patent No.: US 9,180,686 B1
(45) Date of Patent: Nov. 10, 2015

(54) IMAGE TRANSLATION DEVICE PROVIDING NAVIGATIONAL DATA FEEDBACK TO COMMUNICATION DEVICE

(75) Inventors: Patrick A. McKinley, Corvallis, OR (US); James Mealy, Corvallis, OR (US); James D. Bledsoe, Corvallis, OR (US); Asher Simmons, Corvallis, OR (US)

(73) Assignee: Marvell International Ltd., Hamilton (BM)

( * ) Notice: Subject to any disclaimer, the term of this patent is extended or adjusted under 35 U.S.C. 154(b) by 2351 days.

(21) Appl. No.: 12/062,472

(22) Filed: Apr. 3, 2008

Related U.S. Application Data

(60) Provisional application No. 60/910,348, filed on Apr. 5, 2007.

(51) Int. Cl.
*B41J 3/36* (2006.01)
*H01L 27/00* (2006.01)
*G01J 1/32* (2006.01)

(52) U.S. Cl.
CPC .......................................... *B41J 3/36* (2013.01)

(58) Field of Classification Search
None
See application file for complete search history.

(56) References Cited

U.S. PATENT DOCUMENTS 5,278,582 A 1/1994 Hongo
5,387,976 A 2/1995 Lesniak
5,461,680 A 10/1995 Davis
5,578,813 A * 11/1996 Allen et al. ................ 250/208.1
5,927,872 A * 7/1999 Yamada .......................... 400/88
5,930,466 A 7/1999 Rademacher
6,002,124 A * 12/1999 Bohn et al. ................. 250/208.1
6,268,598 B1 * 7/2001 Dow et al. .................. 250/208.1
6,348,978 B1 2/2002 Blumer et al.
6,384,921 B1 5/2002 Saijo et al.
7,200,560 B2 4/2007 Philbert
7,297,912 B1 * 11/2007 Todoroff et al. .............. 250/205
7,410,100 B2 8/2008 Muramatsu
7,607,749 B2 10/2009 Tabata et al.
7,929,019 B2 4/2011 Ohmura et al.
7,949,370 B1 5/2011 Bledsoe et al.
7,988,251 B2 8/2011 Dimitrijevic et al.
2003/0150917 A1 8/2003 Tsikos et al.
2004/0021912 A1 2/2004 Tecu et al.
2004/0208346 A1 * 10/2004 Baharav et al. ............... 382/124
2005/0001867 A1 1/2005 Akase
2006/0012660 A1 1/2006 Dagborn
2006/0061647 A1 3/2006 Breton (Continued)

FOREIGN PATENT DOCUMENTS

AU 2006252324 B1 1/2007
EP 0655706 A1 5/1995

(Continued)

OTHER PUBLICATIONS

U.S. Appl. No. 12/188,056, filed Aug. 7, 2008, Mealy et al.

(Continued)

*Primary Examiner* — Ariel Yu

(57) ABSTRACT

Systems, apparatuses, and methods for an image translation device providing navigational data feedback to a communication device are described herein. The image translation device may operate in a navigational feedback mode to transmit navigational data to the communication device or an active image translation mode to generate position data to facilitate an image translation operation. Other embodiments may be described and claimed.

16 Claims, 7 Drawing Sheets

(56) References Cited

U.S. PATENT DOCUMENTS

| | | | |
|---|---|---|---|
| 2007/0150194 | A1 | 6/2007 | Chirikov |
| 2008/0007762 | A1 | 1/2008 | Robertson et al. |
| 2008/0144053 | A1 | 6/2008 | Gudan et al. |
| 2009/0034018 | A1 | 2/2009 | Lapstun et al. |
| 2009/0279148 | A1 | 11/2009 | Lapstun et al. |
| 2010/0039669 | A1 | 2/2010 | Chang et al. |
| 2010/0231633 | A1 | 9/2010 | Lapstun et al. |

FOREIGN PATENT DOCUMENTS

| | | | |
|---|---|---|---|
| EP | 1209574 | A2 | 5/2002 |
| WO | WO03076196 | A1 | 9/2003 |

OTHER PUBLICATIONS

U.S. Appl. No. 11/955,209, filed Dec. 12, 2007, Bledsoe et al.
U.S. Appl. No. 11/955,228, filed Dec. 12, 2007, Bledsoe et al.
U.S. Appl. No. 11/955,240, filed Dec. 12, 2007, Bledsoe et al.
U.S. Appl. No. 11/955,258, filed Dec. 12, 2007, Simmons et al.
U.S. Appl. No. 11/959,027, filed Dec. 18, 2007, Simmons et al.
U.S. Appl. No. 11/968,528, filed Jan. 2, 2008, Simmons et al.
U.S. Appl. No. 11/972,462, filed Jan. 10, 2008, Simmons et al.
U.S. Appl. No. 12/013,313, filed Jan. 11, 2008, Bledsoe et al.
U.S. Appl. No. 12/016,833, filed Jan. 18, 2008, Simmons et al.
U.S. Appl. No. 12/036,996, filed Feb. 25, 2008, Bledsoe et al.
U.S. Appl. No. 12/037,029, filed Feb. 25, 2008, Bledsoe et al.
U.S. Appl. No. 12/037,043, filed Feb. 25, 2008, Bledsoe et al.
U.S. Appl. No. 12/038,660, filed Feb. 27, 2008, McKinley et al.
U.S. Appl. No. 12/041,496, filed Mar. 8, 2008, Mealy et al.
U.S. Appl. No. 12/041,535, filed Mar. 3, 2008, Mealy et al.
U.S. Appl. No. 12/041,515, filed Mar. 3, 2008, Mealy et al.
Fairchild, "IEEE 1284 Interface Design Solutions", Jul. 1999, Fairchild Semiconductor, AN-5010, 10 pages.
Texas Instruments, "Program and Data Memory Controller", Sep. 2004, SPRU577A, 115 pages.
Drzymala et al., "A Feasibilty Study Using a Stereo-optical Camera System to Verify Gamma Knife Treatment Specifications", Proceedings of the 22nd annual EMBS International Conference, Jul. 23-28, 2000, Chicago, IL, 4 pages.
Liu, "Determiantion of the Point of Fixation in a Head-Fixed Coordinate System", 1998 Proceedings. Fourteenth International Conference on Pattern Recognition; vol. 1; Digital Object Identifier, Published 1998, 4 pages.

* cited by examiner

IMAGE TRANSLATION DEVICE PROVIDING NAVIGATIONAL DATA FEEDBACK TO COMMUNICATION DEVICE

CROSS-REFERENCE TO RELATED APPLICATIONS

This present application is a non-provisional application of provisional application 60/910,348, filed on Apr. 5, 2007 and claims priority to said application. The specification of said application is hereby incorporated in its entirety, except for those sections, if any, that are inconsistent with this specification.

TECHNICAL FIELD

Embodiments of the present invention relate to the field of image translation and, in particular, to an image translation device providing navigational data feedback to a communication device.

BACKGROUND

Wireless communication devices, and mobile telephones in particular, have achieved tremendous popularity among consumers. Many, if not most, consumers own at least one mobile telephone, some of those consumers replacing the traditional landline completely therewith. As such, improvements in capability and functionality of these devices have been met with eager approval. For example, these devices commonly include the most advanced display and image processing technologies as well as text messaging and photographing capabilities. Transforming digital images captured by these devices into a hard-copy format, however, generally has not been available to the consumer in a manner that matches the mobility of these devices. Current desktop printing solutions may be impractical or undesirable options for those consumers who want high-quality printing on the fly.

Traditional printing devices rely on a mechanically operated carriage to transport a print head in a linear direction as other mechanics advance a medium in an orthogonal direction. As the print head moves over the medium an image may be laid down. Portable printers have been developed through technologies that reduce the size of the operating mechanics. However, the principles of providing relative movement between the print head and medium remain the same as traditional printing devices. Accordingly, these mechanics limit the reduction of size of the printer as well as the material that may be used as the medium.

Handheld printing devices have been developed that ostensibly allow an operator to manipulate a handheld device over a medium in order to print an image onto the medium. However, these devices are challenged by the unpredictable and nonlinear movement of the device by the operator. The variations of operator movement make it difficult to determine the precise location of the print head. This type of positioning error may have deleterious effects of the quality of the printed image. This is especially the case for relatively large print jobs, as the positioning error may accumulate in a compounded manner over the entire print operation.

SUMMARY

In accordance with various embodiments a control block, for use in an image translation device, is provided. The control block may have a navigation module configured to control one or more navigation components to capture navigational data; a control module configured to transmit the captured navigational data to a device providing a graphical user interface via a wireless communication interface; and an image translation module configured to control one or more image translation components to translate an image between the apparatus and an adjacent medium based at least in part on the captured navigational data.

In some embodiments, the control module is further configured to operate in an active image translation mode to determine a plurality of positions of the apparatus relative to a reference point based at least in part on the captured navigational data. The control module may also operate in a navigational feedback mode to transmit the navigational data to the device.

In some embodiments, the one or more navigation components comprise a first imaging navigation sensor and a second imaging navigation sensor and the navigation module is further configured to control the first imaging navigation sensor to capture the navigational data while in the navigational feedback mode and to control the first and the second imaging navigation sensors to capture the navigational data while in the active image translation mode.

The control module may be further configured to determine rotational information of the apparatus based at least in part on the navigational data and to transmit the determined rotational information to the device via the communication interface.

In some embodiments, the control block may include a user interface module configured to receive one or more user inputs; and the control module may be further configured to transmit command data to the device via the communication interface based at least in part on the received one or more user inputs.

In some embodiment the control module may receive image data corresponding to the image from the device via the communication interface.

Some embodiments may provide an image translation device. The image translation device may include a communication interface configured to facilitate wireless communications between the system and a device providing a graphical user interface; a navigation arrangement configured to capture navigational data; a control module configured to transmit the captured navigational data to the via the communication interface; and an image translation arrangement configured to translate an image between the system and an adjacent medium based at least in part on the captured navigational data.

The control module of the image translation device may operate in an active image translation mode to determine a plurality of positions of the system relative to a reference point based at least in part on the captured navigational data; or in a navigational feedback mode to transmit the navigational data to the device.

Some embodiments may provide a method for operating an image translation device. The method may include controlling one or more navigational components to capture navigational data; transmitting the captured navigational data to a device providing a graphical user interface via a wireless link; and controlling one or more image translation components to translate an image between the image translation components and an adjacent medium based at least in part on the captured navigational data.

In some embodiments, the method may include operating in an active image translation mode to determine a plurality of positions of the one or more image translation components relative to a reference point based at least in part on the captured navigational data; or operating in a navigational feedback mode to transmit the navigational data to the device.

In some embodiments, the method may also include receiving one or more user inputs; and transmitting command data to the device via the wireless link based at least in part on the received one or more user inputs.

In some embodiments, the method may also include receiving image data corresponding to the image from the device via the wireless link.

Some embodiments provide for a machine-accessible medium having associated instructions which, when executed, results in an image translation device controlling one or more navigational components to capture navigational data; transmitting the captured navigational data to a device providing a graphical user interface via a wireless link; and controlling one or more image translation components to translate an image between the apparatus and an adjacent medium based at least in part on the captured navigational data.

In some embodiments, the associated instructions, when executed, further results in the image translation device operating in an active image translation mode to determine a plurality of positions of the one or more image translation components relative to a reference point based at least in part on the captured navigational data.

In some embodiments, the associated instructions, when executed, further results in the image translation device operating in a navigational feedback mode to transmit the navigational data to the device.

Some embodiments provide another image translation device that includes means for communicatively coupling the apparatus to a device providing a graphical user interface via a wireless link; means for capturing navigational data; means for wirelessly transmitting the captured navigational data to a device providing a graphical user interface via a wireless link; and means for translating an image between the apparatus and an adjacent medium based at least in part on the captured navigational data.

In some embodiments, the image translation device may also include means for determining a plurality of positions of the apparatus relative to a reference point, while the apparatus is in an active image translation mode, based at least in part on the captured navigational data. The means for wirelessly transmitting the captured navigational data may be configured to wireless transmit the captured navigational data while the apparatus is in a navigational feedback mode.

Other features that are considered as characteristic for embodiments of the present invention are set forth in the appended claims.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION

In the following detailed description, reference is made to the accompanying drawings which form a part hereof wherein like numerals designate like parts throughout, and in which are shown, by way of illustration, specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Reference in the specification to "one embodiment" or "an embodiment" means that a particular feature, structure, or characteristic described in connection with the embodiment is included in at least one embodiment. The appearances of the phrase "in one embodiment" in various places in the specification do not necessarily all refer to the same embodiment, but they may.

The phrases "A and/or B" and "A/B" mean (A), (B), or (A and B). The phrase "A, B, and/or C" means (A), (B), (C), (A and B), (A and C), (B and C) or (A, B and C). The phrase "(A) B" means (A B) or (B), that is, A is optional.

Figure 1:
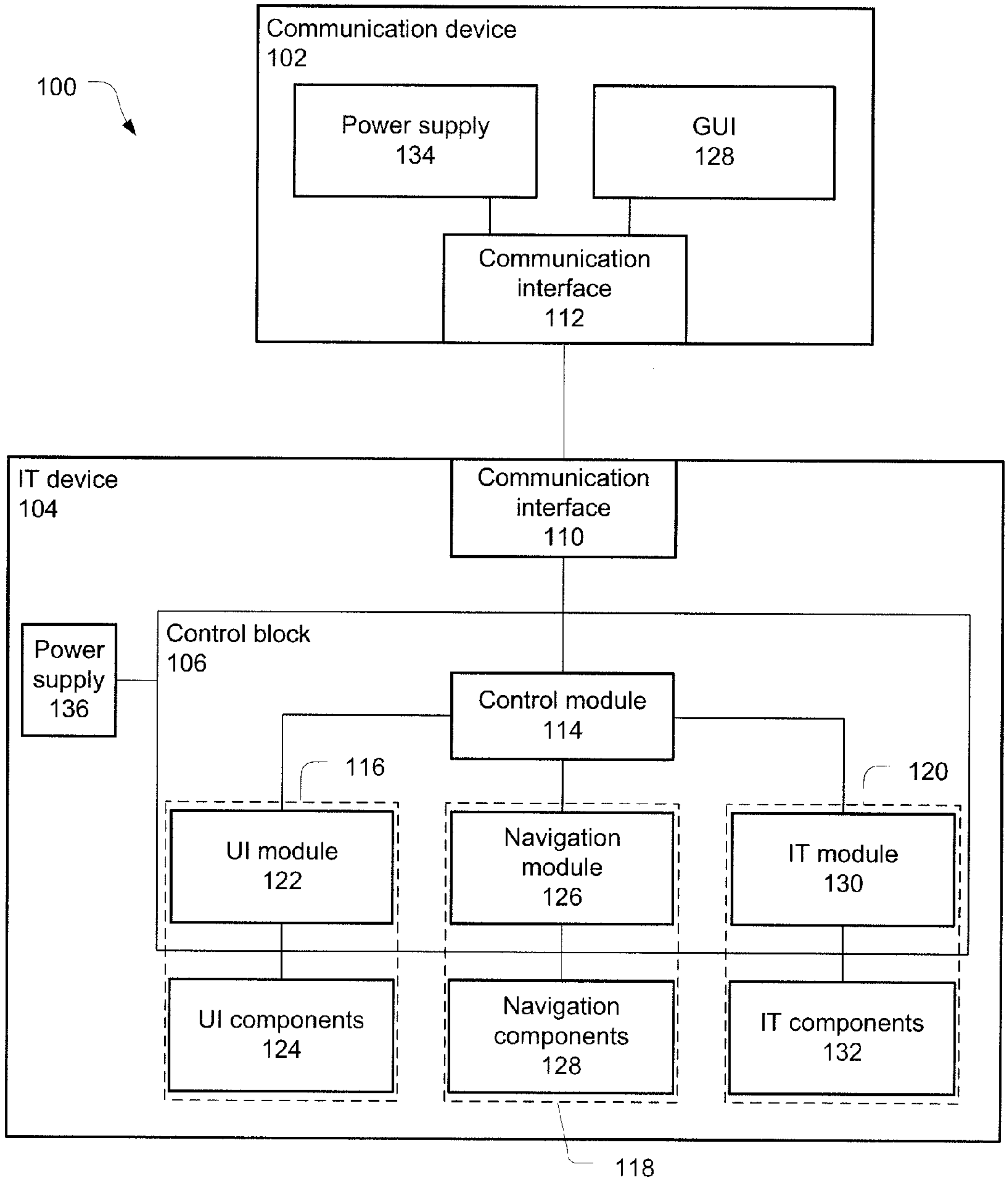
FIG. 1 is a schematic of a system including a communication device and image translation device in accordance with various embodiments of the present invention.

FIG. 1 is a schematic of a system 100 including a communication device 102, hereinafter device 102, communicatively coupled to a handheld image translation device 104, hereinafter IT device 104, in accordance with various embodiments of the present invention. The IT device 104 may include a control block 106 with modules designed to control various components to perform navigation, command, and image translation operations as the IT device 104 is manually manipulated over an adjacent medium.

Image translation, as used herein, may refer to a translation of an image that exists in a particular context (e.g., medium) into an image in another context. For example, an image translation operation may be a scan operation. For scanning operations, a target image, e.g., an image that exists on a tangible medium, is scanned by the IT device 104 and an acquired image that corresponds to the target image is created and stored in memory of the IT device 104. For another example, an image translation operation may be a print operation. In this situation, an acquired image, e.g., an image as it exists in memory of the IT device 104, may be printed onto an adjacent medium.

The IT device 104 may include a communication interface 110 configured to facilitate wireless communications between the control block 106 and a corresponding communication interface 112 of the device 102. The device 102 may be configured to transmit/receive image data related to an IT operation of the IT device 104. For example, the device 102 may transmit image data relating to an image to be printed by the IT device 104. Such images may include images either captured by a camera device of the device 102 or otherwise transmitted to the device 102. Similarly, images may include an image of a text or an e-mail message, a document, or other images.

In another example, the device 102 may receive image data related to an image that has been acquired, through a scan operation, by the IT device 104. The image data may be wirelessly transmitted over a wireless link through the modulation of electromagnetic waves with frequencies in the radio, infrared or microwave spectrums.

A wireless link may contribute to the mobility and versatility of the image translation device 104. However, some embodiments may additionally/alternatively include a wired link communicatively coupling the device 102 to the IT device 104.

In some embodiments, the communication interface 110 may communicate with the device 102 through one or more wired and/or wireless networks including, but not limited to, personal area networks, local area networks, wide area networks, metropolitan area networks, etc. The data transmission may be done in a manner compatible with any of a number of standards and/or specifications including, but not limited to, 802.11, 802.16, Bluetooth, Global System for Mobile Communications (GSM), code-division multiple access (CDMA), Ethernet, etc.

The control block 106 may include a control module 114 to control a variety of arrangements within the IT device 104 in a manner to accomplish a desired operation. In particular, in accordance with an embodiment, the control module 114 may control a user interface (UI) arrangement 116, a navigation arrangement 118, and an IT arrangement 120.

The UI arrangement 116 may include a UI module 122 to control operation of one or more UI components 124 that allow a user to interact with the IT device 104. These UI components 124 may include simple feedback components (e.g., light emitting devices), to provide a user with status information related to an operation, and input components (e.g., buttons, scroll wheels, etc.) for the user to input controls to the IT device 104.

The navigation arrangement 118 may include a navigation module 126 to control operation of one or more navigation components 128 that capture navigational data. The navigation components 128 may include imaging navigation sensors that have a light source (e.g., light-emitting diode (LED), a laser, etc.) and an optoelectronic sensor designed to take a series of pictures of a medium adjacent to the IT device 104 as the IT device 104 is moved over the medium. The navigation module 126 may generate navigational data by processing the pictures provided by imaging navigation sensors to detect structural variations of the medium and, in particular, movement of the structural variations in successive pictures to indicate motion of the image translation device 104 relative to the medium. Navigational data may include a delta value in each direction of a two-dimensional coordinate system, e.g., $\Delta x$ and $\Delta y$. These delta values may be periodically generated whenever motion is detected.

Navigation components 128 may have operating characteristics sufficient to track movement of the image translation device 104 with the desired degree of precision. In an exemplary embodiment, imaging navigation sensors may process approximately 2000 frames per second, with each frame including a rectangular array of 18×18 pixels. Each pixel may detect a six-bit grayscale value, e.g., capable of sensing 64 different levels of gray.

In other embodiments, the navigation components 128 may additionally/alternatively include non-imaging navigation sensors (e.g., an accelerometer, a gyroscope, a pressure sensor, etc.).

The IT arrangement 120 may include an IT module 130 to control operation of one or more IT components 132 that translate an image between the IT device 104 and an adjacent medium. The IT components 132 may include a print head and/or a scan head.

A print head may be an inkjet print head having a plurality of nozzles designed to emit liquid ink droplets. The ink, which may be contained in reservoirs/cartridges, may be black and/or any of a number of various colors. A common, full-color inkjet print head may have nozzles for cyan, magenta, yellow, and black ink. The IT module 130 may control the print head to deposit ink based on navigational data captured by the navigation arrangement 118. Other embodiments may utilize other printing techniques, e.g., toner-based printers such as laser or light-emitting diode (LED) printers, solid ink printers, dye-sublimation printers, inkless printers, etc.

A scan head may have one or more optical imaging sensors that each includes a number of individual sensor elements. Optical imaging sensors may be designed to capture a plurality of surface images of the medium, which may be individually referred to as component surface images. The IT module 130 may then generate a composite image by stitching together the component surface images based on navigational data captured by the navigation arrangement 118.

Relative to imaging navigation sensors, the optical imaging sensors may have a higher resolution, smaller pixel size, and/or higher light requirements. While imaging navigation sensors are configured to capture details about the structure of an underlying medium, optical imaging sensors are configured to capture an image of the surface of the medium itself.

In an embodiment in which the IT device 104 is capable of scanning full color images, the optical imaging sensors may have sensor elements designed to scan different colors.

A composite image acquired by the IT device 104 may be subsequently transmitted to the device 102 by, e.g., e-mail, fax, file transfer protocols, etc. The composite image may be additionally/alternatively stored locally by the IT device 104 for subsequent review, transmittal, printing, etc.

The control module 114 may control the arrangements of the control block 106 based on the operating mode of the IT device 104. In various embodiments, the operating mode may either be an active IT mode, e.g., when the IT components 132 are actively translating an image between the IT device 104 and an adjacent medium, or a navigational feedback mode, when the IT components are not actively translating an image. While the IT device 104 is in the navigational feedback mode, the control module 114 may feed back navigational and command data to the device 102 to control a graphical user interface (GUI) 128.

The device 102 and the IT device 104 may also include power supplies 134 and 136, respectively. The power supplies may be mobile power supplies, e.g., a battery, a rechargeable battery, a solar power source, etc. In other embodiments the power supplies may additionally/alternatively regulate power provided by another component (e.g., another device, a power cord coupled to an alternating current (AC) outlet, etc.).

In some embodiments the device 102 may be a mobile communication device such as, but not limited to, a mobile telephone, a personal digital assistant, or a Smartphone. In other embodiments the device 102 may be a computing device such as, but not limited to, a laptop computing device, a desktop computing device, or a tablet computing device.

Figure 2:
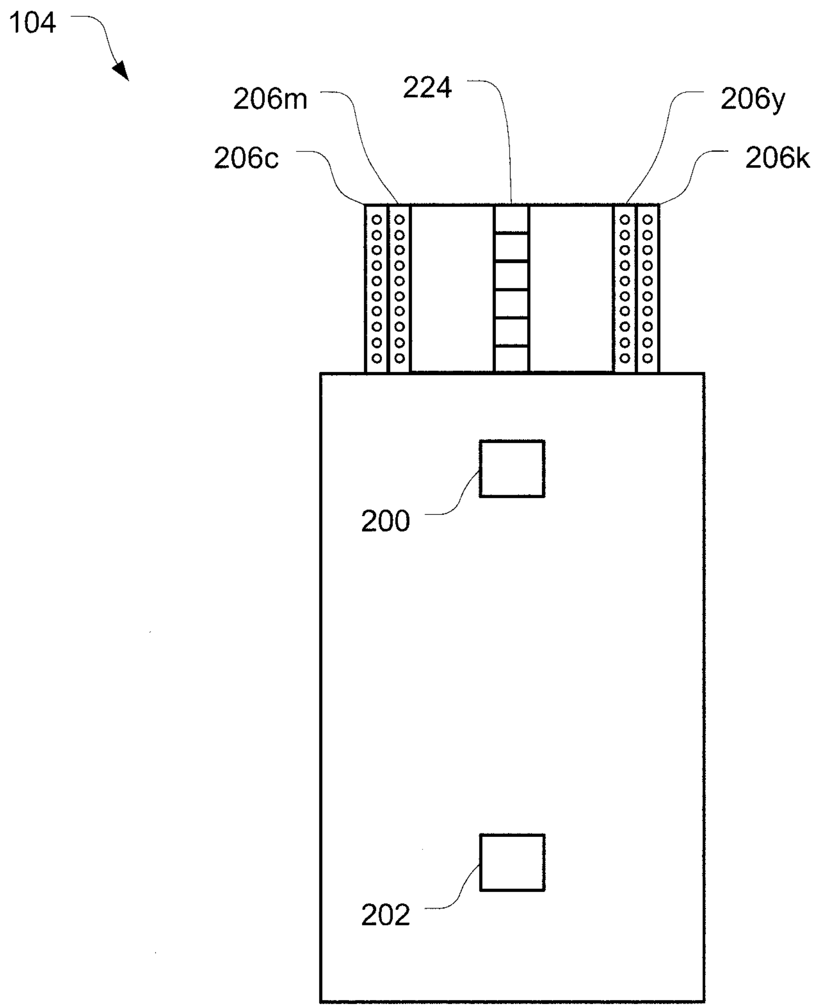
FIG. 2 is a bottom plan view of the image translation device in accordance with various embodiments of the present invention.

FIG. 2 is a bottom plan view of the IT device 104 in accordance with various embodiments of the present invention. In this embodiment, the IT device 104 may have a pair of navigation sensors 200 and 202, a scan head 224, and a print head 206.

The scan head 224 may have a number of optical elements arranged in a row. Similarly, the print head 206 may be an inkjet print head having a number of nozzles arranged in rows. Each nozzle row may be dedicated to a particular color, e.g., nozzle row 206*c* may be for cyan-colored ink, nozzle row 206*m* may be for magenta-colored ink, nozzle row 206*y* may be for yellow-colored ink, and nozzle row 206*k* may be for black-colored ink.

In other embodiments, other configurations of the various components of the scan head 224 and/or print head 206 may be employed.

Figure 3:
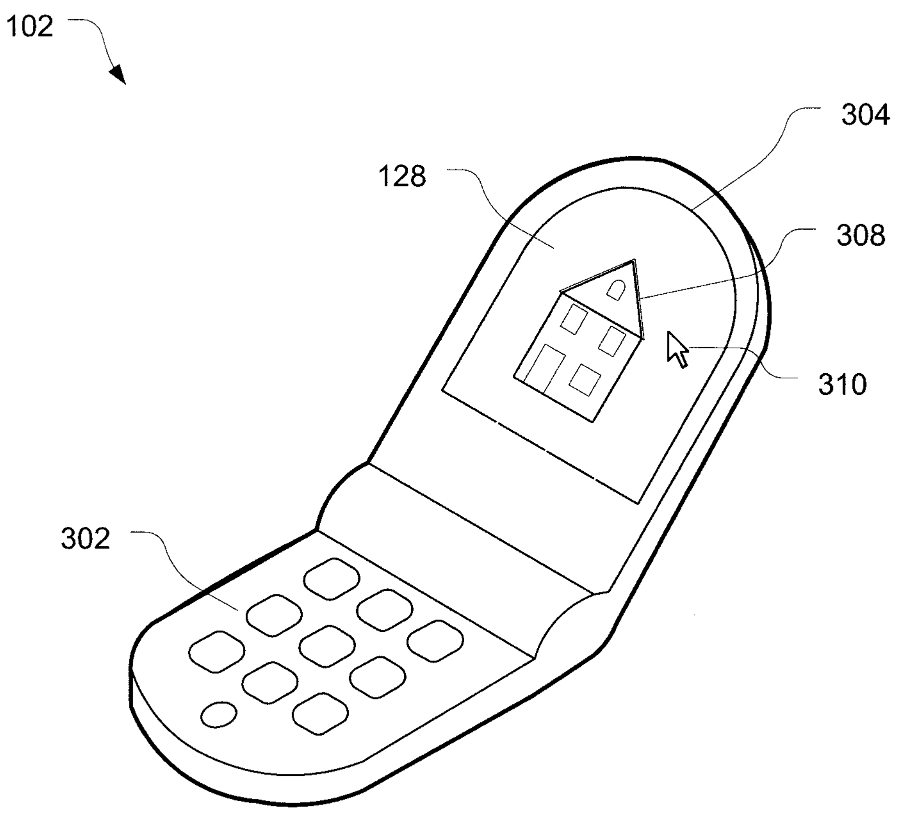
FIG. 3 is a perspective view of the communication device in accordance with various embodiments of the present invention.

FIG. 3 is a perspective view of the device 102 in accordance with various embodiments of the present invention. In this embodiment, the device 102 may be a mobile telephone that includes input components 302 and a display 304 as is generally present on known mobile telephones. The input components 302 may include keys or similar features for inputting numbers and/or letters, adjusting volume and screen brightness, etc. In some embodiments, the input components 302 may be features of the display 304.

The display 304 may be used to present a user with a GUI 128. The GUI 128 may provide the user with a variety of information related to the device 102 and/or IT device 104. For example, the information may relate to the current operating status of the IT device 104 (e.g., printing, ready to print, receiving print image, transmitting print image, etc.), power of the battery, errors (e.g., scanning/positioning/printing error, etc.), instructions (e.g., "position device over a printed portion of the image for reorientation," etc.), etc.

The GUI 128 may also provide the user various control functionality related to operations of the device 102 and/or the IT device 104. For example, the GUI 128 may allow a user to interact with applications executing on the device 102 that allow the user to select an image to be printed, edit an image, start/stop/resume an IT operation of the IT device 104, etc. As shown, an image of a house 308 that has been selected for viewing, editing, and/or printing is displayed on the GUI 128.

In some embodiments, interactive control functionality may be provided to the user through a pointer graphic 310 displayed on the GUI 128. In particular, the pointer graphic 310 may be controlled by navigational and/or command data fed back from the IT device 104 as a result of a user manipulating the IT device 104 as will be discussed in further detail below.

Figure 4:
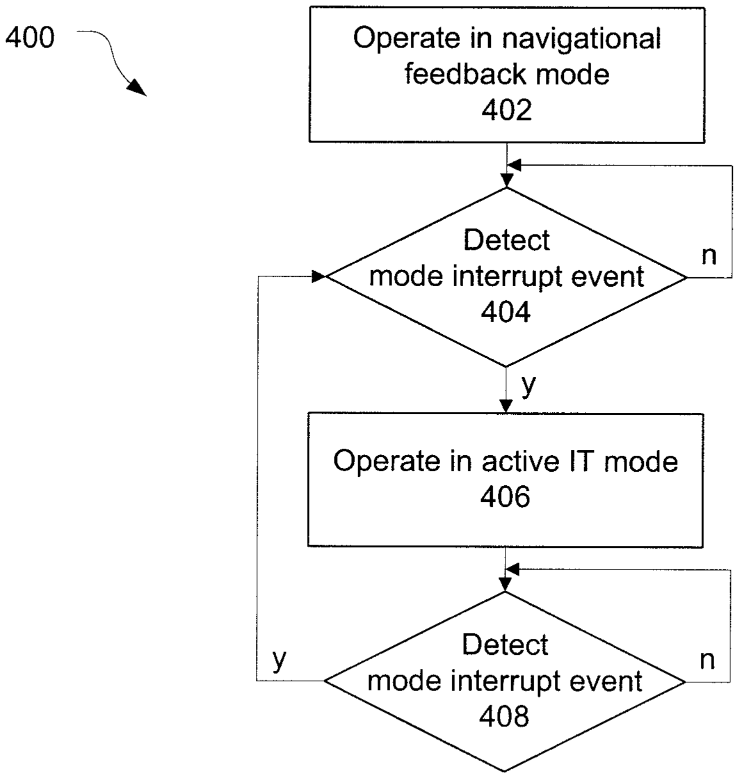
FIG. 4 is a flow diagram depicting operation of a control module of the image translation device in accordance with various embodiments of the present invention.

FIG. 4 is a flow diagram depicting operation of the control module 114 in accordance with various embodiments of the present invention. In some embodiments, the control module 114 may default to operating in a navigational feedback mode at block 402.

While in the navigational feedback mode, the control module 114 may receive navigational data from the navigation arrangement 118 as the IT device 104 is manipulated by a user over an adjacent medium. The control module 114 may then relay this information to the device 102 to control a graphic displayed on the GUI 128, e.g., the pointer graphic 310.

While in the navigational feedback mode, the control module 114 may also receive user inputs from the UI arrangement 116 as the user manipulates the IT device 104. The control module 114 may generate command data based on these user inputs, and relay the command data back to the device 102 to control the pointer graphic 310.

For example, while in the navigational feedback mode, a user may move the IT device 104 in a manner such that the motion results in the pointer graphic 310 being placed over a graphical tool bar or icon. With the pointer graphic 310 in this position, the user may activate a user input of the UI components 124 to activate the associated tool bar or icon. In similar manners, the user may click on items or drag a region on the screen to either select members of a list or a region of an image, thus identifying items to be acted upon with a related action.

While the control module 114 is operating in the navigational feedback mode, it may detect a mode interrupt event at block 404. The mode interrupt event, which may be an "initiate IT operation" event, may originate from the UI arrangement 116, either directly or relayed through the device 102. In response to the detected mode interrupt event, the control module 114 may switch operating modes to an active IT mode at block 406.

While in the active IT mode, the control module 114 may process the navigational data received from the navigation arrangement 118 in a manner more conducive to an IT operation. In particular, in accordance with an embodiment of the present invention, the control module 114 may perform a positioning operation by processing the navigational data into position data determinative of the position of the IT components 132 relative to an established reference point. This may allow the IT module 130 to utilize the position data in accordance with an appropriate function of a particular IT operation.

For example, if the IT operation is a print operation, the IT module 130 may coordinate a location of the print head 208, determined from the position data, to a portion of a print-processed image with a corresponding location. The IT module 130 may then control the print head 208 in a manner to deposit a printing substance on the adjacent medium to represent the corresponding portion of the print-processed image.

As used herein, a print-processed image may refer to image data that resides in memory of the device 104 that has been processed, e.g., by the control module 114, in a manner to facilitate an upcoming print operation of a related image. Processing techniques may include dithering, decompression, half-toning, color plane separation, and/or image storage. In some embodiments, some or all of the processing may be done by the device 102.

In another example, if the IT operation is a scan operation, the IT module 130 may receive component surface images, captured by the scan head 224, and generate a composite image by stitching together the component surface images based on the position data received from the control module 114.

Figure 5:
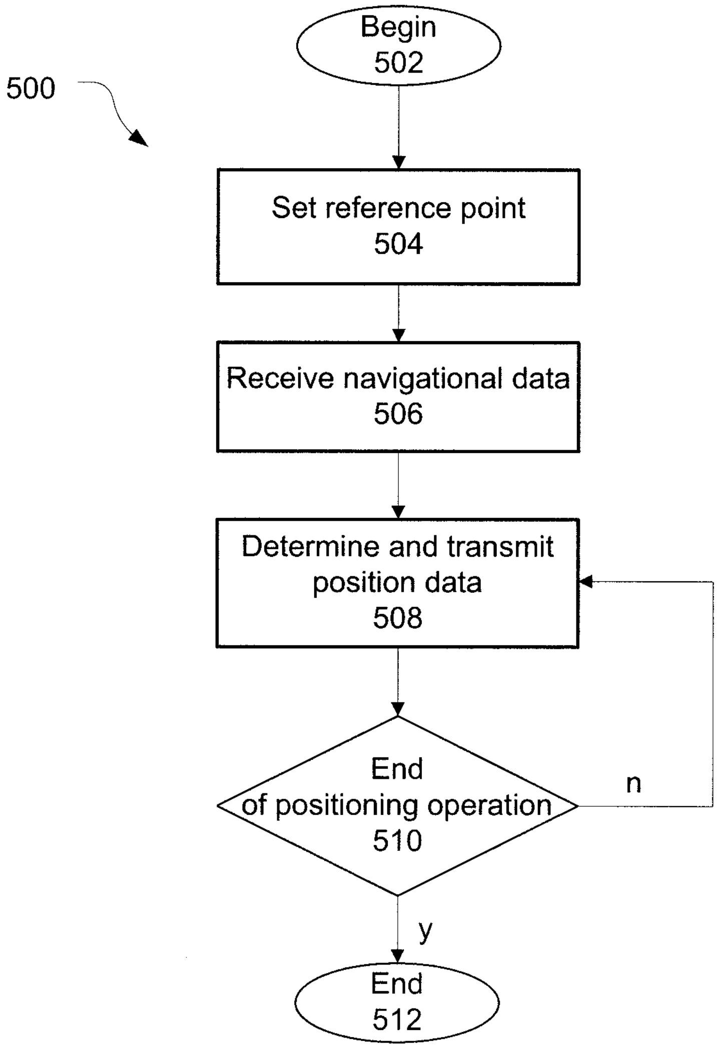
FIG. 5 is a flow diagram depicting a positioning operation of an image translation device in accordance with various embodiments of the present invention.

FIG. 5 is a flow diagram 500 depicting a positioning operation of the control module 114 in accordance with various embodiments of the present invention. A positioning operation may begin at block 502 with an initiation of an IT operation, e.g., by activation of an IT control input of the UI components 124. At block 504, the control module 114 may set a reference point. The reference point may be set when the IT device 104 is placed onto a medium at the beginning of an IT operation. This may be ensured by the user being instructed to activate an IT control input once the IT device 104 is in place and/or by the proper placement of the IT device 104 being treated as a condition precedent to instituting the positioning operation. In some embodiments the proper placement of the IT device 104 on the medium may be automatically determined through sensors of the navigation components 128, sensors of the IT components 132, and/or some other sensors (e.g., a proximity sensor).

Once the reference point is set at block 504, the control module 114 may receive navigational data, e.g., delta values, at block 506. The control module 114 may then determine position data, e.g., translational and rotational changes from the reference point, and transmit the determined position data to the IT module 130 at block 508. The translational changes may be determined by accumulating the captured delta values from the reference point. Rotational changes may refer to changes in the angle of the IT device 104, e.g., ΔΘ, with respect to, e.g., the y-axis. The process of determining these translational and/or rotational changes may be further explained in accordance with some embodiments by reference to FIG. 6 and corresponding discussion.

Figure 6:
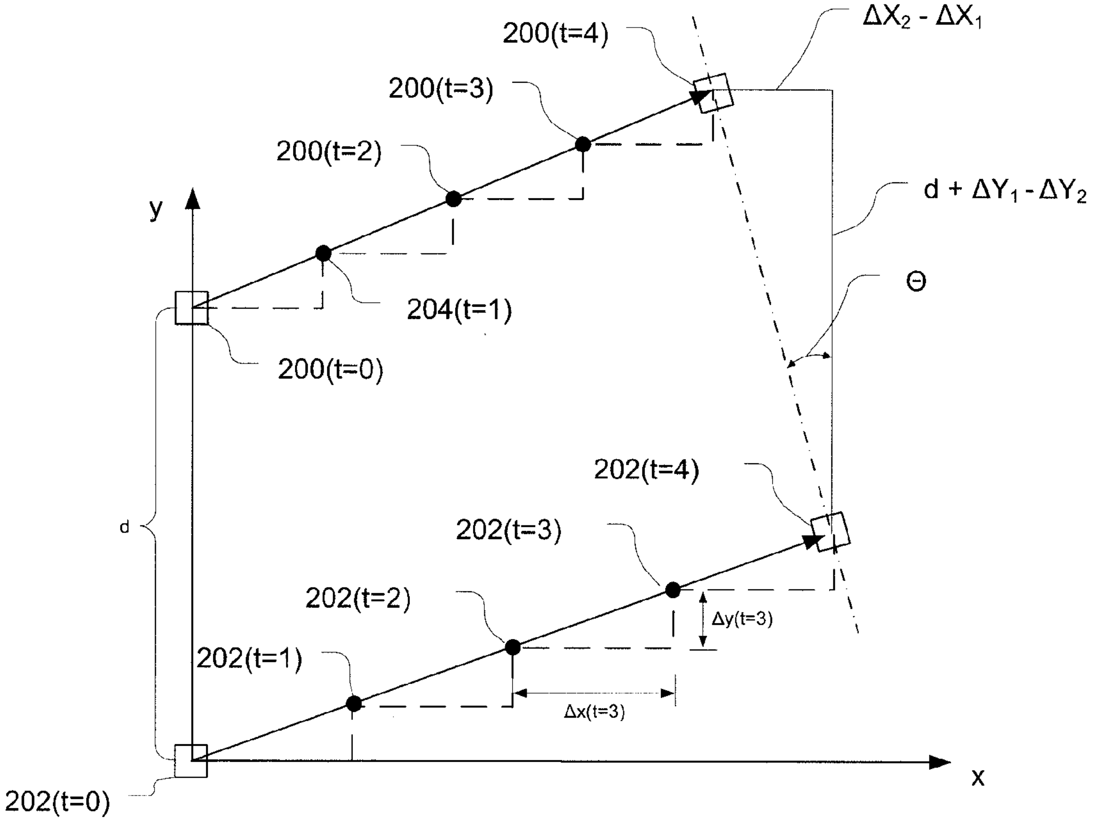
FIG. 6 is a graphic depiction of a positioning operation of the image translation device in accordance with various embodiments of the present invention.

FIG. 6 is a graphic depiction of a positioning operation of the IT device 104 in accordance with embodiments of the present invention. At initiation, e.g., t=0, the navigational sensors 200 and 202 may be in an initial position indicated by 200 (t=0) and 202 (t=0), respectively. Over successive time intervals, e.g., t=1-4, the sensors 200 and 202 may be moved to an end position indicated by 200 (t=4) and 202 (t=4), respectively. As used in description of this embodiment, the "initial position" and the "end position" are used merely with reference to this particular operation and not necessarily the start or end of the printing operation or even other positioning operations.

As the sensors 200 and 202 are moved, they may capture navigational data at each of the indicated time intervals, e.g., t=0-4. The capture period may be synchronized between the sensors 200 and 202 by, e.g., hardwiring together the capture signals transmitted from the navigation module 126. The capture periods may vary and may be determined based on set time periods, detected motion, or some other trigger. In some embodiments, each of the sensors 200 and 202 may have different capture periods that may or may not be based on different triggers.

The captured navigational data may be used by the control module 114 to determine a translation of the IT device 104 relative to a reference point, e.g., the sensors 200 (t=0) and 202 (t=0), as well as a rotation of the IT device 104. In some embodiments, the translation of the device 104 may be determined by analyzing navigational data from a first sensor, e.g., sensor 200, while the rotation of the device 104 may be determined by analyzing navigational data from a second sensor, e.g., sensor 202. In particular, and in accordance with some embodiments, the rotation of the IT device 104 may be determined by comparing translation information derived from the navigational data provided by sensor 202 to translation information derived from navigational measurements provided by sensor 200. Determining both the translation and the rotation of the IT device 104 may allow the accurate positioning of all of the elements of the IT components 132.

The translation of the sensors 200 and 202 may be determined within the context of a world-space (w-s) coordinate system, e.g., a Cartesian coordinate system. In particular, the translation values may be determined for two-dimensions of the w-s coordinate system, e.g., the x-axis and the y-axis as shown in FIG. 6. For example, the position module may accumulate the incremental Δx's and Δy's between successive time periods in order to determine the total translation of the sensors 200 and 202 from time zero to time four. The accumulated changes for sensor 200 may be referred to as ΔX1 and ΔY1 and the accumulated changes for sensor 202 may be referred to as ΔX2 and ΔY2. The sensors 200 and 202 may be a distance d from one another. The rotation Θ of the IT device 104 may then be determined by the following equation:

$$\theta = \sin^{-1}\left(\frac{|\Delta X_2 - \Delta X_1|}{d}\right), . \qquad \text{Equation 1}$$

In some embodiments, each of the sensors 200 and 202 may report navigational data with respect to their native coordinate systems, which may then be mapped to the w-s coordinate system to provide the w-s translation and/or rotation values.

As can be seen from Equation 1, the rotation Θ is derived in part by providing the distance d in the denominator of the arc sine value. Accordingly, a large distance d may provide a more accurate determination of the rotation Θ for a given sensor resolution. Therefore, in designing the IT device 104, the distance d may be established based at least in part on the resolution of the data output from the sensors 200 and 202. For example, if the sensors 200 and 202 have a resolution of approximately 1600 counts per inch, the distance d may be approximately two inches. In an embodiment having this sensor resolution and distance d, the rotation Θ may be reliably calculated down to approximately 0.0179 degrees.

In some embodiments, optical imaging sensors of the scan head 224 may be used to periodically correct for any accumulated positioning errors and/or to reorient the control module 114 in the event the control module 114 loses track of the established reference point. For example, component surface images (whether individually, some group, or collectively as the composite image) that capture sections of the medium that has some portion of the printed image, may be compared to a print-processed image to maintain accurate position data.

Referring again to FIG. 5, following a determination and transmission of position data at block 508, the control module 114 may determine whether the positioning operation is complete at block 510. If it is determined that the positioning operation is not yet complete, the operation may loop back to block 508. If it is determined that it is the end of the positioning operation, the operation may end in block 512. The end of the positioning operation may be tied to the end of an IT operation and/or to receipt of a command via the user arrangement 116.

In some embodiments, it may be that the control module 114 desires different types of navigational data based on the operating mode. For example, if the control module 114 is operating in the active IT mode, it may desire sufficient navigational data to generate position data with a relative high-degree of accuracy. This may include navigational data from both navigation sensor 200 and navigation sensor 202 to facilitate the positioning operations described above.

However, while operating in the navigational feedback mode the control module 114, and ultimately the device 102, may only desire navigational data sufficient to determine relative motion, not actual position. Navigational data from one navigation sensor may be sufficient to determine this type of relative motion. This is especially true given the closed-loop nature of the user manipulating the IT device 104 while simultaneously viewing the corresponding movement of the pointing graphic 310. Accordingly, the control module 114 may power down one of the navigation sensors while in the navigational feedback mode.

Therefore, in some embodiments the navigation module 126 may control either navigation sensor 200 or the navigation sensor 202 to capture the navigational data while in the navigational feedback mode and may control both navigation sensors 200 and 202 to capture the navigational data while in the active image translation mode.

In other embodiments, the device 102 may desire navigational data including more than delta values from one navigational sensor. For example, the device 102 may be implementing an application (e.g., a medical or a gaming application) in which movement of the pointer graphic 310 should very closely correspond to the movement (and/or rotation) of the IT device 104. In these embodiments, navigational data transmitted to the device 102 may be augmented by, e.g., navigational data from an additional sensor, data generated by the control module 114 (e.g., position data, rotational data, and/or translation data), etc. Therefore, in some embodiments, the navigation module 126 may control both imaging navigation sensors 200 and 202 to capture navigational data while in both operating modes.

Figure 7:
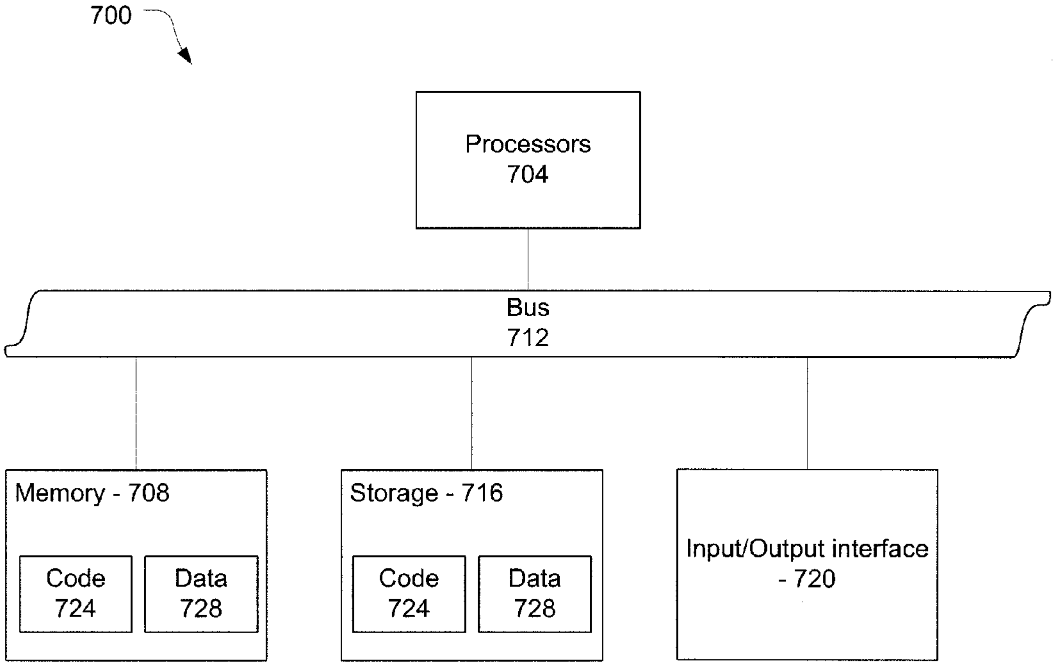
FIG. 7 illustrates a computing device capable of implementing a control block of an image translation device in accordance with various embodiments of the present invention.

FIG. 7 illustrates a computing device 700 capable of implementing a control block, e.g., control block 106, in accordance with various embodiments. As illustrated, for the embodiments, computing device 700 includes one or more processors 704, memory 708, and bus 712, coupled to each other as shown. Additionally, computing device 700 includes storage 716, and one or more input/output interfaces 720 coupled to each other, and the earlier described elements as shown. The components of the computing device 700 may be designed to provide the navigation, command, and/or image translation operations of a control block of an image translation device as described herein.

Memory 708 and storage 716 may include, in particular, temporal and persistent copies of code 724 and data 728, respectively. The code 724 may include instructions that when accessed by the processors 704 result in the computing device 700 performing operations as described in conjunction with various modules of the control block in accordance with embodiments of this invention. The processing data 728 may include data to be acted upon by the instructions of the code 724. In particular, the accessing of the code 724 and data 728 by the processors 704 may facilitate navigation, command, and/or image translation operations as described herein.

The processors 704 may include one or more single-core processors, multiple-core processors, controllers, application-specific integrated circuits (ASICs), etc.

The memory 708 may include random access memory (RAM), dynamic RAM (DRAM), static RAM (SRAM), synchronous DRAM (SDRAM), dual-data rate RAM (DDRRAM), etc.

The storage 716 may include integrated and/or peripheral storage devices, such as, but not limited to, disks and associated drives (e.g., magnetic, optical), USB storage devices and associated ports, flash memory, read-only memory (ROM), non-volatile semiconductor devices, etc. The storage 716 may be a storage resource physically part of the computing device 700 or it may be accessible by, but not necessarily a part of, the computing device 700. For example, the storage 716 may be accessed by the computing device 700 over a network.

The I/O interfaces 720 may include interfaces designed to communicate with peripheral hardware, e.g., UI components 124, navigation components 128, IT components 132, storage components, and/or other devices, e.g., a mobile telephone.

In various embodiments, computing device 700 may have more or less elements and/or different architectures.

Although specific embodiments have been illustrated and described herein, it will be appreciated by those of ordinary skill in the art and others, that a wide variety of alternate and/or equivalent implementations may be substituted for the specific embodiment shown and described without departing from the scope of the present invention. This application is intended to cover any adaptations or variations of the embodiment discussed herein. Therefore, it is manifested and intended that the invention be limited only by the claims and the equivalents thereof.

What is claimed is:

1. An apparatus comprising:

a navigation module configured to control one or more navigation components to capture navigational data, wherein the one or more navigation components comprise a first imaging navigation sensor and a second imaging navigation sensor;

a control module configured to transmit, via a wireless communication interface, the captured navigational data to a device providing a graphical user interface; and an image translation module configured to control one or more image translation components to translate an image between the apparatus and an adjacent medium based at least in part on the captured navigational data, wherein, at any given time, the control module is configured to operate in either (i) an active image translation mode to determine a plurality of positions of the apparatus relative to a reference point based at least in part on the captured navigational data, or (ii) a navigational feedback mode to transmit the captured navigational data to the device, wherein, while in the navigational feedback mode, the navigation module is further configured to control either (i) the first imaging navigation sensor or (ii) the second imaging navigation sensor, and wherein, while in the active image translation mode, the navigation module is further configured to control both (i) the first imaging navigation sensor and (ii) the second imaging navigation sensor.

2. The apparatus of claim 1, wherein the control module is further configured to determine rotational information of the apparatus based at least in part on the captured navigational data and to transmit the determined rotational information to the device via the wireless communication interface.

3. The apparatus of claim 1, further comprising:

a user interface module configured to receive one or more user inputs, and wherein the control module is further configured to transmit command data to the device via the wireless communication interface based at least in part on the received one or more user inputs.

4. The apparatus of claim 1, wherein the control module is further configured to receive image data corresponding to the image from the device via the wireless communication interface.

5. A system comprising:

a communication interface configured to facilitate communications between the system and a device providing a graphical user interface;

a navigation arrangement configured to capture navigational data;

a control module configured to transmit the captured navigational data to the device via the communication interface; and an image translation arrangement configured to translate an image between the system and an adjacent medium based at least in part on the captured navigational data, wherein, at any given time, the control module is further configured to operate in one of (i) an active image translation mode, and (ii) a navigational feedback mode, and wherein while the control module operates in the navigational feedback mode, transmission of the captured navigational data to the device facilitates controlling the graphical user interface.

6. The system of claim 5, wherein the control module is further configured to operate in the active image translation mode to determine a plurality of positions of the system relative to a reference point based at least in part on the captured navigational data.

7. The system of claim 5, wherein transmission of the captured navigational data to the device, while the control module operates in the navigational feedback mode, facilitates controlling a pointer graphic of the graphical user interface.

8. The system of claim 5, wherein transmission of the captured navigational data to the device, while the control module operates in the navigational feedback mode, facilitates navigating through the graphical user interface.

9. A method comprising:

controlling one or more navigational components to capture navigational data;

transmitting the captured navigational data to a device providing a graphical user interface;

controlling one or more image translation components to translate an image between the image translation components and an adjacent medium based at least in part on the captured navigational data; and at any given time, operating in one of (i) an active image translation mode and (ii) a navigational feedback mode, wherein transmitting the captured navigational data further comprises while operating in the navigational feedback mode, transmitting the captured navigational data to the device to facilitate controlling the graphical user interface.

10. The method of claim 9, wherein operating in the active image translation mode further comprises:

operating in the active image translation mode to determine a plurality of positions of the one or more image translation components relative to a reference point based at least in part on the captured navigational data.

11. The method of claim 9, further comprising:

receiving one or more user inputs; and transmitting command data to the device via the wireless link based at least in part on the received one or more user inputs.

12. The method of claim 9, further comprising:

receiving image data corresponding to the image from the device via a wireless link.

13. A machine-accessible medium having associated instructions which, when executed, results in an apparatus:

controlling one or more navigational components to capture navigational data;

transmitting, via a wireless link, the captured navigational data to a device providing a graphical user interface;

controlling one or more image translation components to translate an image between the apparatus and an adjacent medium based at least in part on the captured navigational data; and at any given time, operating in one of (i) an active image translation mode and (ii) a navigational feedback mode, wherein transmitting the captured navigational data further comprises while operating in the navigational feedback mode, transmitting the captured navigational data to the device, to facilitate controlling the graphical user interface.

14. The machine-accessible medium of claim 13, wherein operating in the active image translation mode further comprises:

operating in the active image translation mode to determine a plurality of positions of the one or more image translation components relative to a reference point based at least in part on the captured navigational data.

15. An apparatus comprising:

means for capturing navigational data;

means for transmitting, via a wireless link, the captured navigational data to a device providing a graphical user interface;

means for translating an image between the apparatus and an adjacent medium based at least in part on the captured navigational data; and means for operating, at any given time, in one of (i) an active image translation mode and (ii) a navigational feedback mode, wherein the means for transmitting further comprises means for transmitting the captured navigational data to the device, while operating in the navigational feedback mode, to facilitate controlling the graphical user interface.

16. The apparatus of claim 15, further comprising:

means for determining a plurality of positions of the apparatus relative to a reference point, while the apparatus is in the active image translation mode, based at least in part on the captured navigational data.

* * * * *